(12) United States Patent
Zhao

(10) Patent No.: US 11,043,552 B2
(45) Date of Patent: Jun. 22, 2021

(54) DIELECTRIC FILM LAYER STRUCTURE AND FABRICATING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Kaixiang Zhao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 241 days.

(21) Appl. No.: 16/468,285

(22) PCT Filed: Apr. 11, 2019

(86) PCT No.: PCT/CN2019/082280
§ 371 (c)(1),
(2) Date: Jun. 11, 2019

(87) PCT Pub. No.: WO2020/118985
PCT Pub. Date: Jun. 18, 2020

(65) Prior Publication Data
US 2020/0203077 A1  Jun. 25, 2020

(30) Foreign Application Priority Data

Dec. 14, 2018 (CN) .......................... 201811536565.6

(51) Int. Cl.
*H01L 49/02* (2006.01)
*H01G 4/12* (2006.01)
(Continued)

(52) U.S. Cl.
CPC ............. *H01L 28/40* (2013.01); *H01G 4/129* (2013.01); *H01G 4/306* (2013.01);
(Continued)

(58) Field of Classification Search
CPC .... H01G 4/306; H01G 4/129; H01L 27/0629; H01L 27/0288; H01L 28/40;
(Continued)

(56) References Cited

U.S. PATENT DOCUMENTS 6,171,978 B1 * 1/2001 Lin ..................... H01L 21/3145
 438/775
2004/0051114 A1 * 3/2004 Brindle ............... H01L 27/0203
 257/151

(Continued)

*Primary Examiner* — Eduardo A Rodela
(74) *Attorney, Agent, or Firm* — Mark M. Friedman

(57) ABSTRACT

A dielectric film layer structure and a fabricating method thereof are provided. The dielectric film layer structure at least has a first capacitor electrode, a dielectric layer, and a second capacitor electrode, wherein the dielectric layer includes two materials of SiNx and SiOx. In a place where voltage drop is relatively large, the dielectric layer is mainly made of SiNx, and in a place where the voltage drop is relatively small, the dielectric layer is mainly made of SiOx, thereby changing current for charging thin film transistors, reducing influence of the voltage drop, and improving uniformity of panel voltage output.

20 Claims, 3 Drawing Sheets

(51) Int. Cl.
    *H01G 4/30*       (2006.01)
    *H01L 27/12*      (2006.01)
    *H01L 27/02*      (2006.01)
    *H01L 27/06*      (2006.01)

(52) U.S. Cl.
    CPC ...... *H01L 27/0288* (2013.01); *H01L 27/0629* (2013.01); *H01L 27/1255* (2013.01)

(58) Field of Classification Search
    CPC . H01L 27/1255; H01L 27/1259; H01L 28/55; H01L 28/56; H01L 27/3265
    See application file for complete search history.

(56) References Cited

U.S. PATENT DOCUMENTS

| | | | |
|---|---|---|---|
| 2006/0017675 A1* | 1/2006 | Shimoshikiryoh | G09G 3/3655 345/87 |
| 2007/0048953 A1* | 3/2007 | Gealy | H01L 21/28194 438/305 |
| 2009/0213148 A1* | 8/2009 | Takasugi | G09G 3/30 345/690 |

* cited by examiner

DIELECTRIC FILM LAYER STRUCTURE AND FABRICATING METHOD THEREOF

FIELD OF DISCLOSURE

The present disclosure relates to display device fabrication, and more particularly, to a dielectric film layer structure and a fabricating method thereof.

BACKGROUND OF DISCLOSURE

There are many display pixels on display devices. In order to save a huge hardware drive circuit, a matrix type structure is implemented. That is, electrodes of a set of horizontal display pixels are connected together and referred to as row electrodes, and segment electrodes of a set of vertical display pixels are connected together and referred to as column electrodes. Each of the display pixels on the display device is determined by positions in a column and a row at which it is located. In a driving method, a raster scanning method is adopted correspondingly. A dynamic driving method of the display device applies a selection pulse to the row electrodes through a scan line loop, and all the column electrodes displaying data give corresponding selective or non-selective driving pulses through the data lines, thereby realizing a display function of all display pixels in a certain row. This row line scan is performed line by line, with a short cycle time, resulting in a stable picture on a display screen.

Material of the scan lines and the data lines are all metal. Due to resistance of metal, as a transmission distance increases, voltage will decrease, for example, voltage away from a signal input terminal is less than voltage close to the signal input terminal, resulting in insufficient voltage output uniformity of the display device.

From above, there is a problem that voltage drop of existing display devices causes insufficient voltage output uniformity when voltage is transmitted. Therefore, it is necessary to provide a dielectric film layer structure and a fabricating method thereof to improve this defect.

SUMMARY OF DISCLOSURE

Material of the scan lines and the data lines are all metal. Due to the metal having resistance, as a transmission distance increases, voltage will decrease, i.e., the voltage away from a signal input terminal is smaller than the voltage close to the signal input terminal, resulting in insufficient voltage output uniformity of the display device.

The present disclosure provides a dielectric film layer structure and a fabricating method thereof, which is used to solve a problem that voltage drop of existing display device causes insufficient voltage output uniformity when the voltage is transmitted.

The present disclosure provides a fabricating method of a dielectric film layer, comprising:
  a step S10 of providing a substrate and depositing a layer of SiNx on a first capacitor electrode on the substrate to form a silicon nitride layer;
  a step S20 of depositing a layer of SiOx on the silicon nitride layer to form a silicon oxide layer, wherein the silicon nitride layer and the silicon oxide layer together constitute a dielectric layer; and
  a step S30 of forming a second capacitor electrode on the dielectric layer, wherein a ratio of SiNx in the dielectric layer increases along a scanning direction of data lines and a scanning direction of scan lines, and a ratio of SiOx in the dielectric layer decreases along the scanning direction of the data lines and the scanning direction of the scan lines.

According to an embodiment of the present disclosure, the step S10 comprises:
  a step S101 of coating a layer of photoresist on the first capacitor electrode to form a first photoresist layer;
  a step S102 of masking a first mask on the substrate, and exposing and developing the first photoresist layer; and
  a step S103 of depositing the layer of SiNx on the first photoresist layer, wherein after depositing the silicon nitride layer, the first photoresist layer is stripped to pattern the silicon nitride layer.

According to an embodiment of the present disclosure, the step S20 comprises:
  a step S201 of coating a layer of photoresist on the silicon nitride layer to form a second photoresist layer;
  a step S202 of masking a second mask on the substrate, and exposing and developing the second photoresist layer; and
  a step S203 of depositing the layer of SiOx, wherein after depositing the silicon oxide layer, the second photoresist layer is stripped to form pattern the silicon oxide layer.

According to an embodiment of the present disclosure, the first mask is provided with a plurality of first transparent regions, wherein the plurality of first transparent regions are arranged in an array along the scanning direction of the data lines and the scanning direction of the scan lines, and the plurality of first transparent regions are aligned to pixels of the substrate.

According to an embodiment of the present disclosure, the second mask is provided with a plurality of second transparent regions, wherein the plurality of second transparent regions are arranged in an array along the scanning direction of the data lines and the scanning direction of the scan lines, and the plurality of second transparent regions are aligned to the pixels of the substrate.

According to an embodiment of the present disclosure, area of the plurality of first transparent regions increases along the scanning direction of the data lines and the scanning direction of the scan lines, and area of the plurality of second transparent regions decreases along the scanning direction of the data lines and the scanning direction of the scan lines.

According to an embodiment of the present disclosure, in the step S10, a surface of the substrate is shielded by a first blocking plate when the silicon nitride layer is formed, and after depositing the silicon nitride layer, the first blocking layer is stripped.

According to an embodiment of the present disclosure, in the step S20, the surface of the substrate is shielded by a second blocking plate when the silicon oxide layer is formed, and after depositing the silicon oxide layer, the second blocking layer is stripped.

According to an embodiment of the present disclosure, both the first blocking plate and the second blocking plate are provided with a plurality of grids, the plurality of grids are arranged in an array along the scanning direction of the data lines and the scanning direction of the scan lines, and the plurality of grids are aligned to pixels of the substrate, wherein grid area of the first blocking plate decreases along the scanning direction of the data lines and the scanning direction of the scan lines, and grid area of the second blocking plate increases along the scanning direction of the data lines and the scanning direction of the scan lines.

The present disclosure provides a fabricating method of a dielectric film layer, comprising:

a step S10 of providing a substrate and depositing a layer of SiNx on a first capacitor electrode on the substrate to form a silicon nitride layer;

a step S20 of depositing a layer of SiOx on the silicon nitride layer to form a silicon oxide layer, wherein the silicon nitride layer and the silicon oxide layer together constitute a dielectric layer; and a step S30 of forming a second capacitor electrode on the dielectric layer, wherein a ratio of SiNx in the dielectric layer increases along a first direction and a second direction, and a ratio of SiOx in the dielectric layer decreases along the first direction and the second direction, wherein the second direction is vertical to the first direction.

According to an embodiment of the present disclosure, the step S10 comprises:

a step S101 of coating a layer of photoresist on the first capacitor electrode to form a first photoresist layer;

a step S102 of masking a first mask on the substrate, and exposing and developing the first photoresist layer; and a step S103 of depositing the layer of SiNx on the first photoresist layer, wherein after depositing the silicon nitride layer, the first photoresist layer is stripped to pattern the silicon nitride layer.

According to an embodiment of the present disclosure, the step S20 comprises:

a step S201 of coating a layer of photoresist on the silicon nitride layer to form a second photoresist layer;

a step S202 of masking a second mask on the substrate, and exposing and developing the second photoresist layer; and a step S203 of depositing the layer of SiOx, wherein after depositing the silicon oxide layer, the second photoresist layer is stripped to pattern the silicon oxide layer.

According to an embodiment of the present disclosure, the first mask is provided with a plurality of first transparent regions, wherein the plurality of first transparent regions are arranged in an array along the first direction and the second direction, and the plurality of first transparent regions are aligned to pixels of the substrate.

According to an embodiment of the present disclosure, the second mask is provided with a plurality of second transparent regions, wherein the plurality of second transparent regions are arranged in an array along the first direction and the second direction, and the plurality of second transparent regions are aligned to pixels of the substrate.

According to an embodiment of the present disclosure, area of the plurality of first transparent regions increases along the first direction and the second direction, and area of the plurality of second transparent regions decreases along the first direction and the second direction.

According to an embodiment of the present disclosure, in the step S10, a surface of the substrate is shielded by a first blocking plate when the silicon nitride layer is formed, and after depositing the silicon nitride layer, the first blocking layer is stripped.

According to an embodiment of the present disclosure, in the step S20, the surface of the substrate is shielded by a second blocking plate when the silicon oxide layer is formed, and after depositing the silicon oxide layer, the second blocking layer is stripped.

According to an embodiment of the present disclosure, both the first blocking plate and the second blocking plate are provided with a plurality of grids, the plurality of grids are arranged in an array along the first direction and the second direction, and the plurality of grids are aligned to pixels of the substrate, wherein grid area of the first blocking plate decreases along the first direction and the second direction, and grid area of the second blocking plate increases along the first direction and the second direction.

The present disclosure provides a dielectric film layer structure, comprising:

a first capacitor electrode;

a dielectric layer disposed on the first capacitor electrode; and a second capacitor electrode disposed on the dielectric layer, wherein the first capacitor electrode, the dielectric layer, and the second capacitor electrode together constitute a storage capacitor of a display panel, wherein the dielectric layer consists of two materials of SiNx and SiOx, wherein a ratio of SiNx in the dielectric layer increases along a first direction and a second direction, and a ratio of SiOx in the dielectric layer decreases along the first direction and the second direction.

According to an embodiment of the present disclosure, the second direction is vertical to the first direction, wherein the first direction is a scanning direction of data lines, and the second direction is a scanning direction of scan lines.

Beneficial effects of the present disclosure are that: in an embodiment of the present disclosure, SiNx and SiOx are used as material of the capacitor dielectric layer, and a ratio of SiNx in the capacitor dielectric layer increases along a signal transmission direction, and a ratio of SiOx in the capacitor dielectric layer decreases along the signal transmission direction. Since a dielectric constant of SiNx is larger than that of SiOx, in a place where voltage drop is relatively large, the dielectric layer is mainly made of SiNx to store more charges, and a capacitor charges a relatively large amount of current to thin film transistors, causing the thin film transistors to be in a high voltage state. In a place where voltage drop is relatively small, the dielectric layer is mainly made of SiOx to store less charges, and the capacitor charges a relatively small amount of current to the thin film transistors, causing the thin film transistors to be in a low voltage state, thereby changing current for charging thin film transistors, reducing influence of the voltage drop, and improving uniformity of panel voltage output.

DESCRIPTION OF DRAWINGS

In order to more clearly describe embodiments of the present disclosure or technical solutions in a conventional technology, drawings required to be used for the embodiments or descriptions of the conventional technology are simply described hereinafter. Apparently, the drawings described below only illustrate some embodiments of the present disclosure. Those skilled in the art can obtain other drawings based on these drawings disclosed herein without creative effort.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc. are only directions by referring to the accompanying drawings. Thus, the used directional terms are used to describe and understand the present disclosure, but the present disclosure is not limited thereto. In figures, elements with similar structures are indicated with the same numbers.

The disclosure is described in detail below with reference to the accompanying drawings and specific embodiments:

Embodiment 1

Figure 1:
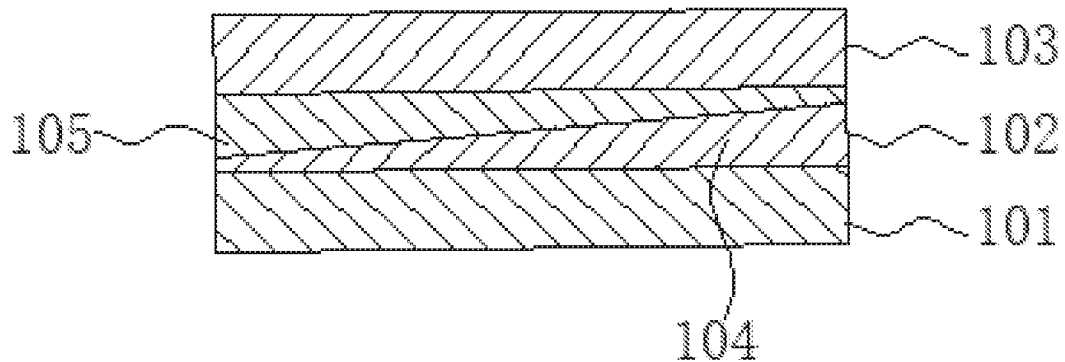
FIG. 1 is a structural schematic diagram of a dielectric film layer according to an embodiment of the present disclosure.

An embodiment of the present disclosure provides a dielectric film layer structure. As shown in FIG. 1, FIG. 1 is a structural schematic diagram of a dielectric film layer according to the present embodiment. The dielectric film layer structure includes a first capacitor electrode 101, a dielectric layer 102 disposed on the first capacitor electrode 101, a second capacitor electrode 103 disposed on the dielectric layer 102, wherein the first capacitor electrode 101, the dielectric layer 102, and the second capacitor electrode 103 together constitute a storage capacitor of a display panel.

In the present embodiment, the dielectric layer 102 consists of silicon nitride layer 104 and a silicon oxide layer 105, wherein a ratio of SiNx in the dielectric layer increases along a first direction and a second direction, and a ratio of SiOx in the dielectric layer decreases along the first direction and the second direction. Because a dielectric constant of SiNx is greater than a dielectric constant of SiOx, SiNx stores more charge than SiOx under the same mass, and voltage drop is small at one end near data lines and scan lines. Therefore, the dielectric layer 102 at the one end near data lines and scan lines is mainly made of SiOx. At this time, a capacitor charges thin film transistors with a relatively small current, which causes the thin film transistors to be in a low voltage state. The voltage drop is high at one end away from the data lines and the scan lines, the dielectric layer 102 at the one end away from the data lines and the scan lines is mainly made of SiNx. At this time, the capacitor charges the thin film transistors with a relatively high current, which causes the thin film transistors to be in a high voltage state.

Figure 5:
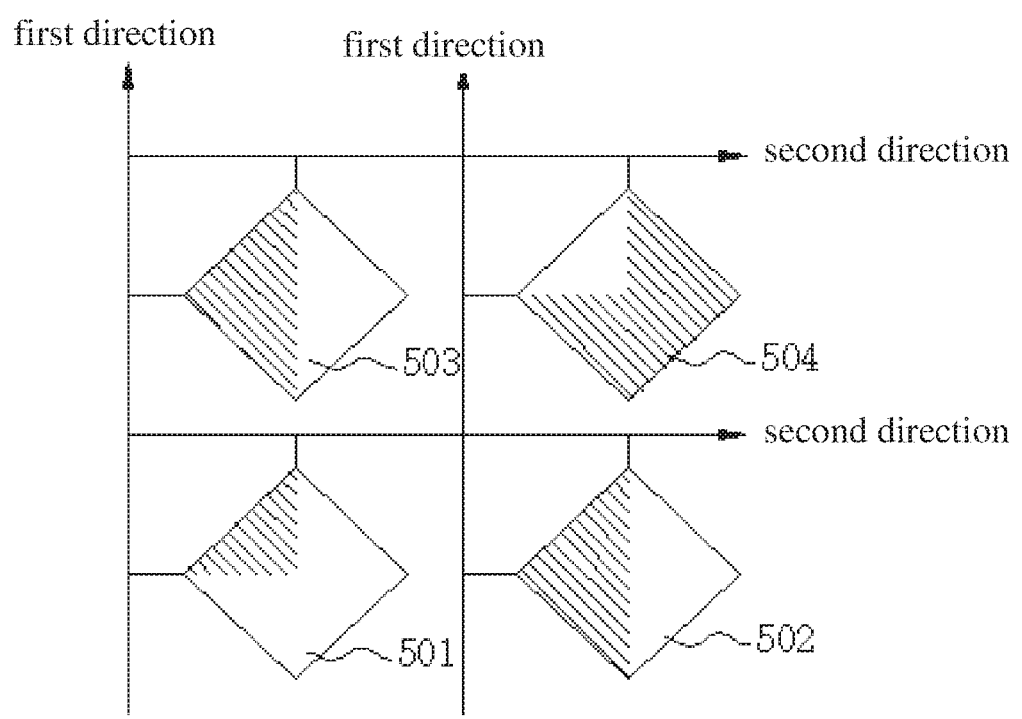
FIG. 5 is a top-view diagram of a pixel structure of a display device according to an embodiment of the present disclosure.

As shown in FIG. 5, FIG. 5 is a top-view diagram of a pixel structure of a display device, wherein the first direction is a scanning direction of data lines, and the second direction is a scanning direction of scan lines, wherein the second direction is vertical to the first direction. A plurality of pixels are arranged in an array along the first direction and the second direction to together constitute a driving circuit of the display device. FIG. 5 merely shows a portion of the pixels, such as a first pixel 501, a second pixel 502, a third pixel 503, and a fourth pixel 504m wherein a shaded portion of the pixels is SiNx, and a blank portion is SiOx. The first pixel 501 is closest to the data lines and the scan lines, and the voltage drop is the smallest, so a ratio of SiOx in the dielectric layer of the first pixel 501 is the largest, and a ratio of SiNx ratio in the dielectric layer of the first pixel 501 is the smallest. The second pixel 502 and the third pixel 503 are slightly farther from the data lines or the scan lines, and the voltage drop is larger than that of the first pixel 501. Therefore, the SiOx in the dielectric layer of the second pixel 502 and the third pixel 503 is relatively small, and the SiNx in the dielectric layer of the second pixel 502 and the third pixel 503 is relatively large. The fourth pixel 504 is farthest from the data lines and the scan lines, and the voltage drop is the largest, so the dielectric layer of the fourth pixel 504 has the smallest SiOx ratio and the most SiNx ratio.

The present embodiment provides a fabricating method of a dielectric film layer structure. In the present embodiment, the dielectric film layer structure provided by the first embodiment is referred to, and the fabricating method provided by the embodiment is described in detail below with reference to FIG. 1 to FIG. 5.

Figure 2:
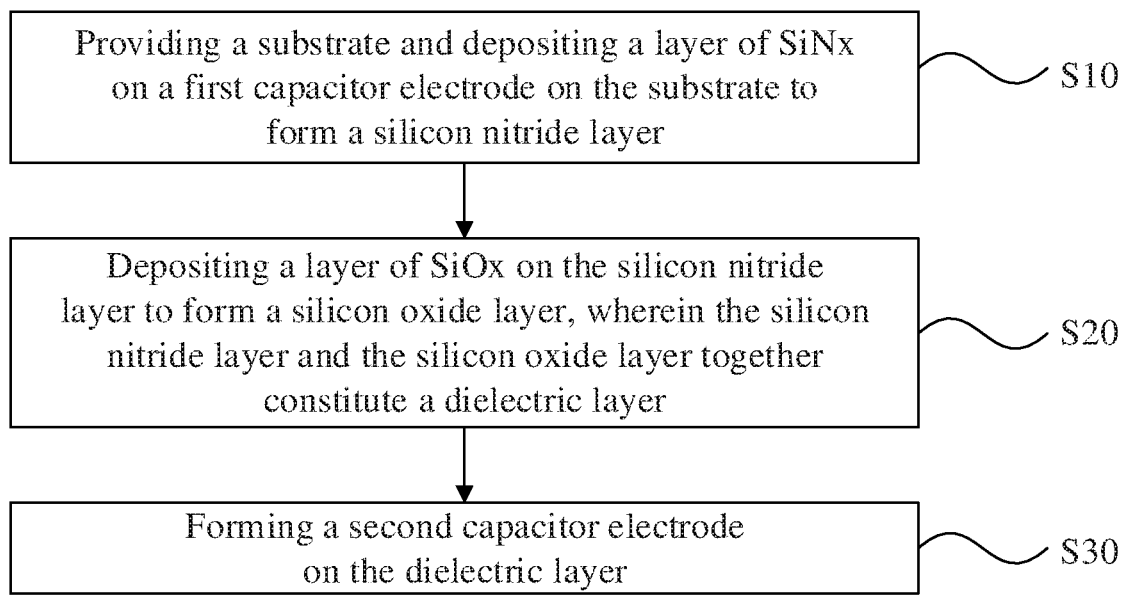
FIG. 2 is a flowchart of a fabricating method of a dielectric film layer according to an embodiment of the present disclosure.

As shown in FIG. 2, FIG. 2 is a flowchart of a fabricating method of a dielectric film layer according to the present embodiment. The method comprises:
  a step S10 of providing a substrate (not shown) and depositing a layer of SiNx on a first capacitor electrode 101 on the substrate to form a silicon nitride layer 104;
  a step S20 of depositing a layer of SiOx on the silicon nitride layer 104 to form a silicon oxide layer 105, wherein the silicon nitride layer 104 and the silicon oxide layer 105 together constitute a dielectric layer 102; and
  a step S30 of forming a second capacitor electrode 103 on the dielectric layer 102,
  wherein a ratio of SiNx in the dielectric layer 102 increases along a first direction and a second direction, and a ratio of SiOx in the dielectric layer 102 decreases along the first direction and the second direction, wherein the first direction is a scanning direction of data lines, and the second direction is a scanning direction of scan lines.

Embodiment 2

Figure 3:
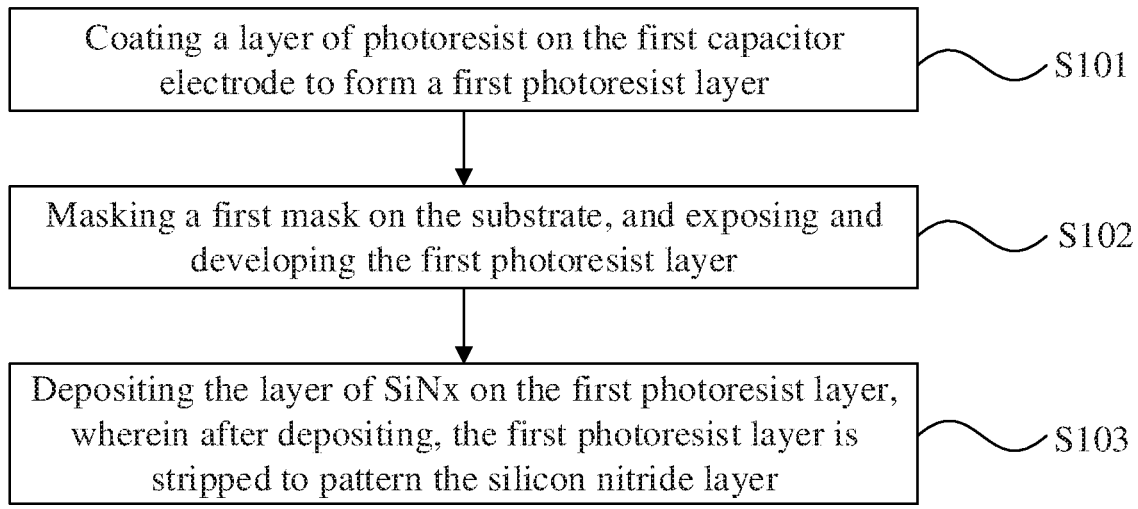
FIG. 3 is a flowchart of a fabricating method of a dielectric film layer according to an embodiment of the present disclosure.

In the present embodiment, as shown in FIG. 3, the step S10 further comprises:
  a step S101 of coating a layer of photoresist on the first capacitor electrode 101 to form a first photoresist layer;
  a step S102 of masking a first mask on the substrate, and exposing and developing the first photoresist layer; and
  a step S103 of depositing the layer of SiNx on the first photoresist layer, wherein after depositing the silicon nitride layer, the first photoresist layer is stripped to pattern the silicon nitride layer 104.

Figure 4:
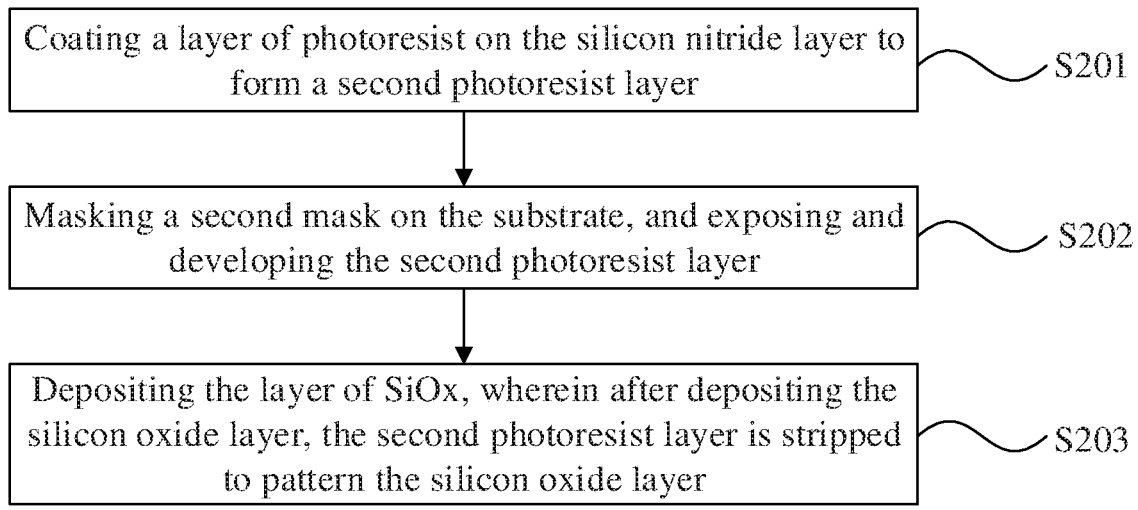
FIG. 4 is a flowchart of a fabricating method of a dielectric film layer according to an embodiment of the present disclosure.

In the present embodiment, as shown in FIG. 4, the step S20 further comprises:
  a step S201 of coating a layer of photoresist on the silicon nitride layer 104 to form a second photoresist layer;
  a step S202 of masking a second mask on the substrate, and exposing and developing the second photoresist layer; and
  a step S203 of depositing the layer of SiOx, wherein after depositing the silicon oxide layer, the second photoresist layer is stripped to form pattern the silicon oxide layer 105, wherein the silicon nitride layer 104 and the silicon oxide layer 105 together constitute the dielectric layer 102

In the present embodiment, a ratio of SiNx and SiOx in the dielectric layer is changed by a yellow light process. A desired photoresist pattern is obtained mainly by exposing and developing the first photoresist layer coated on the silicon nitride layer 104 and the second photoresist layer on the silicon oxide layer 105. Further, a desired ratio of SiNx and SiOx is obtained by depositing SiNx and SiOx.

The first mask (not shown) is provided with a plurality of first transparent regions, wherein the plurality of first transparent regions are arranged in an array, and the plurality of first transparent regions are aligned to pixels of the substrate. Simultaneously, the second mask is provided with a plurality of second transparent regions, wherein the plurality of second transparent regions are arranged in an array, and the plurality of second transparent regions are aligned to the pixels of the substrate.

In the present embodiment, an area of the plurality of first transparent regions increases along the first direction and the second direction, and an area of the plurality of second transparent regions decreases along the first direction and the second direction.

In this embodiment, a selected photoresist is a positive photoresist. When the step S102 is performed, the first mask is used. As shown in FIG. 5, the transparent region at the first pixel 501 is the smallest, and the transparent region at the fourth pixel 504 is the largest, so after the step S102, the photoresist blocking region at the first pixel 501 is the largest, and the photoresist blocking region at the fourth pixel 504 is the smallest. After the SiNx is deposited in step S103, a SiNx ratio at the first pixel 501 is the smallest, and the SiNx ratio at the fourth pixel 504 is the largest.

Simultaneously, when the step S202 is performed, the second mask is used. The transparent region at the first pixel 501 is the largest, and the transparent region at the fourth pixel 504 is the smallest, so after the step S202, the photoresist blocking region at the first pixel 501 is the smallest, and the photoresist blocking region at the fourth pixel 504 is the largest. After the SiOx is deposited in step S202, a ratio of SiOx at the first pixel 501 is the largest, and a ratio of SiOx at the fourth pixel 504 is the smallest. Thus, an effect can be obtained that the ratio of SiNx in the dielectric layer 102 is in an increasing state along both the first direction and the second direction, and an effect can be obtained that the ratio of SiOx in the dielectric layer 102 is in a decreasing state along both the first direction and the second direction.

Embodiment 3

The present embodiment provides a fabricating method of a dielectric film layer structure. In the present embodiment, the dielectric film layer structure provided by the first embodiment is referred to, and the fabricating method provided by the embodiment is described in detail below with reference to FIG. 1 to FIG. 5.

As shown in FIG. 2, FIG. 2 is a flowchart of a fabricating method of a dielectric film layer according to the present embodiment. The method comprises:

a step S10 of providing a substrate (not shown) and depositing a layer of SiNx on a first capacitor electrode 101 on the substrate to form a silicon nitride layer 104;

a step S20 of depositing a layer of SiOx on the silicon nitride layer 104 to form a silicon oxide layer 105, wherein the silicon nitride layer 104 and the silicon oxide layer 105 together constitute a dielectric layer 102; and a step S30 of forming a second capacitor electrode 103 on the dielectric layer 102, wherein a ratio of SiNx in the dielectric layer 102 increases along a first direction and a second direction, and a ratio of SiOx in the dielectric layer 102 decreases along the first direction and the second direction, wherein the first direction is a scanning direction of data lines, and the second direction is a scanning direction of scan lines.

In the present embodiment, in the step S10, a surface of the substrate is shielded by a first blocking plate (not shown) when the silicon nitride layer is formed, and after depositing the silicon nitride layer 104, the first blocking layer is stripped. The first blocking plate is provided with a plurality of grids, the plurality of grids are arranged in an array along the first direction and the second direction, and a grid area of the first blocking plate decreases along the first direction and the second direction, such that the ratio of SiNx in the dielectric layer 102 increases along both the first direction and the second direction.

In the present embodiment, in the step S20, a surface of the substrate is shielded by a second blocking plate (not shown) when the silicon oxide layer is formed, and after depositing the silicon oxide layer 105, the second blocking layer is stripped. Simultaneously, the second blocking plate is provided with a plurality of grids, the plurality of grids are arranged in an array along the first direction and the second direction, and the plurality of grids are aligned to pixels of the substrate. A grid area of the second blocking plate increases along the first direction and the second direction, such that the ratio of SiOx in the dielectric layer 102 decreases along both the first direction and the second direction.

In an embodiment of the present disclosure, SiNx and SiOx are used as material of the capacitor dielectric layer, and a ratio of SiNx in the capacitor dielectric layer increases along a signal transmission direction, and a ratio of SiOx in the capacitor dielectric layer decreases along the signal transmission direction. Because a dielectric constant of SiNx is larger than that of SiOx, in a place where voltage drop is relatively large, the dielectric layer is mainly made of SiNx to store more charges, and a capacitor charges a relatively large amount of current to thin film transistors, causing the thin film transistors to be in a high voltage state. In a place where voltage drop is relatively small, the dielectric layer is mainly made of SiOx to store less charges, and the capacitor charges a relatively small amount of current to the thin film transistors, causing the thin film transistors to be in a low voltage state, thereby changing current for charging thin film transistors, reducing influence of the voltage drop, and improving uniformity of panel voltage output.

As described above, although the present disclosure has been described in preferred embodiments, they are not intended to limit the disclosure. One of ordinary skill in the art, without departing from the spirit and scope of the disclosure within, can make various modifications and variations, so the range of the scope of the disclosure is defined by the claims.

The invention claimed is:

1. A fabricating method of a dielectric film layer, comprising:

a step S10 of providing a substrate and depositing a layer of SiNx on a first capacitor electrode on the substrate to form a silicon nitride layer;

a step S20 of depositing a layer of SiOx on the silicon nitride layer to form a silicon oxide layer, wherein the silicon nitride layer and the silicon oxide layer together constitute a dielectric layer; and a step S30 of forming a second capacitor electrode on the dielectric layer, wherein a ratio of SiNx in the dielectric layer increases along a scanning direction of data lines and a scanning direction of scan lines, and a ratio of SiOx in the dielectric layer decreases along the scanning direction of the data lines and the scanning direction of the scan lines.

2. The fabricating method according to claim 1, wherein the step S10 comprises:
  a step S101 of coating a layer of photoresist on the first capacitor electrode to form a first photoresist layer;
  a step S102 of masking a first mask on the substrate, and exposing and developing the first photoresist layer; and
  a step S103 of depositing the layer of SiNx on the first photoresist layer, wherein after depositing the silicon nitride layer, the first photoresist layer is stripped to pattern the silicon nitride layer.

3. The fabricating method according to claim 2, wherein the step S20 comprises:
  a step S201 of coating a layer of photoresist on the silicon nitride layer to form a second photoresist layer;
  a step S202 of masking a second mask on the substrate, and exposing and developing the second photoresist layer; and
  a step S203 of depositing the layer of SiOx, wherein after depositing the silicon oxide layer, the second photoresist layer is stripped to form pattern the silicon oxide layer.

4. The fabricating method according to claim 3, wherein the first mask is provided with a plurality of first transparent regions, wherein the plurality of first transparent regions are arranged in an array along the scanning direction of the data lines and the scanning direction of the scan lines, and the plurality of first transparent regions are aligned to pixels of the substrate.

5. The fabricating method according to claim 4, wherein the second mask is provided with a plurality of second transparent regions, wherein the plurality of second transparent regions are arranged in an array along the scanning direction of the data lines and the scanning direction of the scan lines, and the plurality of second transparent regions are aligned to the pixels of the substrate.

6. The fabricating method according to claim 5, wherein an area of the plurality of first transparent regions increases along the scanning direction of the data lines and the scanning direction of the scan lines, and an area of the plurality of second transparent regions decreases along the scanning direction of the data lines and the scanning direction of the scan lines.

7. The fabricating method according to claim 1, wherein in the step S10, a surface of the substrate is shielded by a first blocking plate when the silicon nitride layer is formed, and after depositing the silicon nitride layer, the first blocking layer is stripped.

8. The fabricating method according to claim 7, wherein in the step S20, the surface of the substrate is shielded by a second blocking plate when the silicon oxide layer is formed, and after depositing the silicon oxide layer, the second blocking layer is stripped.

9. The fabricating method according to claim 8, wherein both the first blocking plate and the second blocking plate are provided with a plurality of grids, the plurality of grids are arranged in an array along the scanning direction of the data lines and the scanning direction of the scan lines, and the plurality of grids are aligned to pixels of the substrate, wherein a grid area of the first blocking plate decreases along the scanning direction of the data lines and the scanning direction of the scan lines, and a grid area of the second blocking plate increases along the scanning direction of the data lines and the scanning direction of the scan lines.

10. A fabricating method of a dielectric film layer, comprising:
  a step S10 of providing a substrate and depositing a layer of SiNx on a first capacitor electrode on the substrate to form a silicon nitride layer;
  a step S20 of depositing a layer of SiOx on the silicon nitride layer to form a silicon oxide layer, wherein the silicon nitride layer and the silicon oxide layer together constitute a dielectric layer; and
  a step S30 of forming a second capacitor electrode on the dielectric layer, wherein a ratio of SiNx in the dielectric layer increases along a first direction and a second direction, and a ratio of SiOx in the dielectric layer decreases along the first direction and the second direction, wherein the second direction is vertical to the first direction.

11. The fabricating method according to claim 10, wherein the step S10 comprises:
  a step S101 of coating a layer of photoresist on the first capacitor electrode to form a first photoresist layer;
  a step S102 of masking a first mask on the substrate, and exposing and developing the first photoresist layer; and
  a step S103 of depositing the layer of SiNx on the first photoresist layer, wherein after depositing the silicon nitride layer, the first photoresist layer is stripped to pattern the silicon nitride layer.

12. The fabricating method according to claim 11, wherein the step S20 comprises:
  a step S201 of coating a layer of photoresist on the silicon nitride layer to form a second photoresist layer;
  a step S202 of masking a second mask on the substrate, and exposing and developing the second photoresist layer; and
  a step S203 of depositing the layer of SiOx, wherein after depositing the silicon oxide layer, the second photoresist layer is stripped to pattern the silicon oxide layer.

13. The fabricating method according to claim 12, wherein the first mask is provided with a plurality of first transparent regions, wherein the plurality of first transparent regions are arranged in an array along the first direction and the second direction, and the plurality of first transparent regions are aligned to pixels of the substrate.

14. The fabricating method according to claim 13, wherein the second mask is provided with a plurality of second transparent regions, wherein the plurality of second transparent regions are arranged in an array along the first direction and the second direction, and the plurality of second transparent regions are aligned to the pixels of the substrate.

15. The fabricating method according to claim 14, wherein an area of the plurality of first transparent regions increases along the first direction and the second direction, and an area of the plurality of second transparent regions decreases along the first direction and the second direction.

16. The fabricating method according to claim 10, wherein in the step S10, a surface of the substrate is shielded by a first blocking plate when the silicon nitride layer is formed, and after depositing the silicon nitride layer, the first blocking layer is stripped.

17. The fabricating method according to claim 16, wherein in the step S20, the surface of the substrate is shielded by a second blocking plate when the silicon oxide layer is formed, and after depositing the silicon oxide layer, the second blocking layer is stripped.

18. The fabricating method according to claim 17, wherein both the first blocking plate and the second blocking plate are provided with a plurality of grids, the plurality of grids are arranged in an array along the first direction and the second direction, and the plurality of grids are aligned to pixels of the substrate, wherein a grid area of the first blocking plate decreases along the first direction and the second direction, and a grid area of the second blocking plate increases along the first direction and the second direction.

19. A dielectric film layer structure, comprising:
a first capacitor electrode;
a dielectric layer disposed on the first capacitor electrode; and
a second capacitor electrode disposed on the dielectric layer, wherein the first capacitor electrode, the dielectric layer, and the second capacitor electrode together constitute a storage capacitor of a display panel, wherein the dielectric layer consists of two materials of SiNx and SiOx, wherein a ratio of SiNx in the dielectric layer increases along a first direction and a second direction, and a ratio of SiOx in the dielectric layer decreases along the first direction and the second direction.

20. The dielectric film layer structure according to claim 19, wherein the second direction is vertical to the first direction, wherein the first direction is a scanning direction of data lines, and the second direction is a scanning direction of scan lines.

* * * * *